United States Patent [19]

Nishimura

[11] Patent Number: 5,184,075
[45] Date of Patent: Feb. 2, 1993

[54] METHOD AND APPARATUS FOR COMPENSATING FOR NONUNIFORMITY OF STATIC MAGNETIC FIELD IN MRI SYSTEM

[75] Inventor: Hiroshi Nishimura, Kashiwa, Japan

[73] Assignee: Hitachi Medical Corporation, Tokyo, Japan

[21] Appl. No.: 647,407

[22] Filed: Jan. 29, 1991

[30] Foreign Application Priority Data

Jan. 31, 1990 [JP] Japan .................................. 2-019042

[51] Int. Cl.⁵ .............................................. G01V 3/00
[52] U.S. Cl. ...................................... 324/309; 324/320
[58] Field of Search ............... 324/300, 307, 309, 320, 324/318, 322; 128/653 A

[56] References Cited

U.S. PATENT DOCUMENTS

| | | | |
|---|---|---|---|
| 4,647,858 | 3/1987 | Bottomley | 324/320 |
| 4,926,124 | 5/1990 | Le Roux | 324/309 |
| 5,003,263 | 3/1991 | Kasama et al. | 324/309 |

Primary Examiner—Louis Arana
Attorney, Agent, or Firm—Antonelli, Terry, Stout & Kraus

[57] ABSTRACT

A method and apparatus for compensating for nonuniformity of a static magnetic field in a MRI system wherein one of X-, Y- and Z-axes of a Cartesian coordinate system is selected as a phase encoding direction, a region of a field of view is selectively excited by applying a high frequency pulse of a predetermined angle to an object under inspection, and an NMR signal is measured by applying a phase encoding gradient magnetic field and a frequency encoding gradient magnetic field after application of the high frequency pulse for a plurality of times while changing the phase encoding gradient magnetic field. A peak value is detected of the measurement data obtained for determining a phase encoding quantity at which the peak value can be obtained, an intensity and a polarity of a linear component of nonuniformity components of the static magnetic field in the direction selected is determined by obtaining an intensity and a polarity of the phase encoding gradient magnetic field corresponding to the peak value, and a pulse sequence for measuring the NMR signal is executed by applying a gradient magnetic field added with a compensating gradient magnetic field having the same intensity as the linear component and a polarity opposite to the linear component to a gradient magnetic field applied in the selected direction.

10 Claims, 6 Drawing Sheets

METHOD AND APPARATUS FOR COMPENSATING FOR NONUNIFORMITY OF STATIC MAGNETIC FIELD IN MRI SYSTEM

BACKGROUND OF THE INVENTION

The present invention relates to a nuclear magnetic resonance imaging system (also referred to as MRI system in abbreviation) for obtaining a topographic image by making use of a nuclear magnetic resonance phenomenon (also referred to as NMR phenomenon). More particularly, the present invention is concerned with a method and an apparatus for measuring an NMR signal while compensating for nonuniformity of a static magnetic field.

In recent years, the MRI system attracts a good deal of attention and is coming into wide use because the system can make available not only anatomical information such as an image reconstructed by visualizing X-ray absorption coefficients obtained by an X-ray CT (computerized tomography) system but also biochemical, chemical shift and bloodstream information.

However, the MRI system suffers some problems in connection with NMR measurement. As one of such problems, there can be mentioned nonuniformity of the static magnetic field.

For example, in the case of an MRI system of permanent magnet type in which permanent magnets of Nd-Fe-B series are used, the temperature coefficient of one magnet element is as great as $-900$ ppm/°C., which in turn means that uniformity of the magnetic field varies remarkably as a function of temperature. However, when the magnetic circuit is implemented in a self-shield structure, a circumscribing yoke member exhibits a large thermal time constant, whereby the abovementioned value of the temperature coefficient can be made smaller. In practical application, a thermoregulating system is provided in an effort to ensure stability of the whole magnetic circuit over a time period to thereby prevent nonuniformity from taking place in the static magnetic field.

In the MRI system in which a vertical magnetic field structure is adopted, magnetic poles of N and S polarities are disposed vertically in opposition to each other, wherein thermoregulation is performed for the top and bottom magnets. In this conjunction, it is noted that when the thermoregulating control of the top and bottom magnets undergoes deviations for some reason, nonuniformity components make appearance in the static magnetic field, wherein a linear nonuniformity component varying linearly along the Z-axis taken in the vertical direction becomes more noticeable to thereby exert adverse influence to the image reconstructed.

In general, in the measurement of the NMR signal in the MRI system, a signal having a maximum amplitude is obtained at a time point when a phase encoding quantity is zero, as shown in FIG. 1 of the accompanying drawings. Further, as can be seen in FIG. 2 which illustrates schematically the data obtained by an NMR signal measurement, a signal peak is located at the center A of a field of view (also referred to as visual field) extending along a phase encoding direction and a frequency encoding direction (read-out direction), wherein NMR signal components of same levels are distributed coaxially about the peak A. Under the circumstance, in the MRI system known heretofore, dynamic range of an analogue-to-digital or A/D converter is set up with the value of the NMR signal corresponding to zero phase encoding being selected as a maximum value of the dynamic range, whereon the image processing is performed. However, when nonuniformity takes place in the static magnetic field, giving birth to a nonuniformity component Gyo in the static magnetic field at zero phase encoding which component is equivalent to a phase encoding gradient magnetic field and has a minus or negative sign as viewed in the phase encoding direction, then the signal peak as measured actually is shifted from the point A to a point B shown in FIG. 2. Parenthetically, FIG. 3 of the accompanying drawings shows a sectional view taken along a line II—II in FIG. 2. Referring to FIG. 3, when the value of the signal at zero phase encoding is recognized as the peak, as with the case of the prior art system, then the signal peak value which is intrinsically 1.0 is recognized to be 0.5, which means that a valid signal component is deleted, bringing about distortion in the image reconstructed.

Further, when NMR measurement is performed by resorting to a gradient echo method and a spin echo method, a slice selecting gradient magnetic field is applied for selecting a slice at the time when an object under inspection is irradiated with radio frequency (RF) pulses. In this conjunction, if a gradient magnetic field ascribable to nonuniformity of the static magnetic field, the thickness of the slice as well as position selected for the slice undergo variation or degradation in respect to the accuracy, giving rise to another problem.

In the MRI system, occurrence of abnormality in the thermoregulating system can not endanger the safety. However, when nonuniformity takes place in the static magnetic field due to the abnormality, there will occur image distortion as well as variations in the slice thickness characteristics, as pointed out above, which of course provides difficulty for diagnosis, a problem to be solved.

SUMMARY OF THE INVENTION

It is therefore an object of the present invention to provide an NMR measuring method and apparatus which allow normal images to be reconstructed by compensating for nonuniformities possibly occurring in the static magnetic field due to abnormality in the thermoregulating system or other causes.

For achieving the above object, it is taught by the invention to perform the NMR signal measurement by steps mentioned below. Before performing the intrinsic NMR measurement, a pulse sequence for measuring nonuniformity of the static magnetic field is activated, whereby a partial measurement around zero phase encoding is conducted. Through data processing of the signal thus obtained, degree of nonuniformity of the static magnetic field is determined. Upon performing the intrinsic NMR signal measurement, a compensating gradient magnetic field of the intensity corresponding to the degree of nonuniformity of the static magnetic field measured as mentioned above is additionally applied for thereby acquiring an image signal which is substantially unaffected by the influence of nonuniformity of the static magnetic field.

More specifically, let's assume that the nonuniformity components of the static magnetic field contain a linear component whose intensity changes linearly as a function of a distance, and that the direction of the linear component is the same as the phase encoding direction. In that case, the linear nonuniformity component is obviously of the same dimension as the gradient magnetic field. Consequently, when the measurement is performed by resorting to the gradient echo method, a gradient magnetic field ascribable to the nonuniformity of the static magnetic field is also measured as the field applied additionally or extraneously. As a result, the signal peak at that time is measured at an encoding quantity (level) deviated from zero encoding by a distance corresponding to the intensity of the gradient magnetic field given birth to by the nonuniformity of the static magnetic field. By way of example, let's assume that the signal peak makes appearance at an encoding quantity of k. Then, the intensity G of the gradient magnetic field at the encoding quantity k can be determined on the basis of a relation between phase rotation $\theta$ and the intensity G of the gradient magnetic field which is given by $$\theta = \gamma \cdot G \cdot D \cdot t$$

where t represents a time for which the gradient magnetic field H is applied, $\gamma$ represents a gyromagnetic ratio and D represents a diameter of the field of view upon measurement, wherein $\theta = k\pi$ (k represents a rational number). The gradient field intensity G is the linear component of nonuniformity of the static magnetic field.

Thus, when a gradient magnetic field which corresponds to the linear nonuniformity component of the static magnetic field and which is determined by the preliminary measurement is applied with polarity opposite to that of the nonuniformity component at the time when the intrinsic NMR signal measurement is performed, then the peak of the measured signal takes place at the zero encoding position, whereby measurement of the NMR signal can be performed without being affected by the influence of the nonuniformity of the static magnetic field.

DESCRIPTION OF THE PREFERRED EMBODIMENTS

Now, the present invention will be described in detail in conjunction with exemplary or preferred embodiments thereof by reference to the accompanying drawings.

Figure 4:
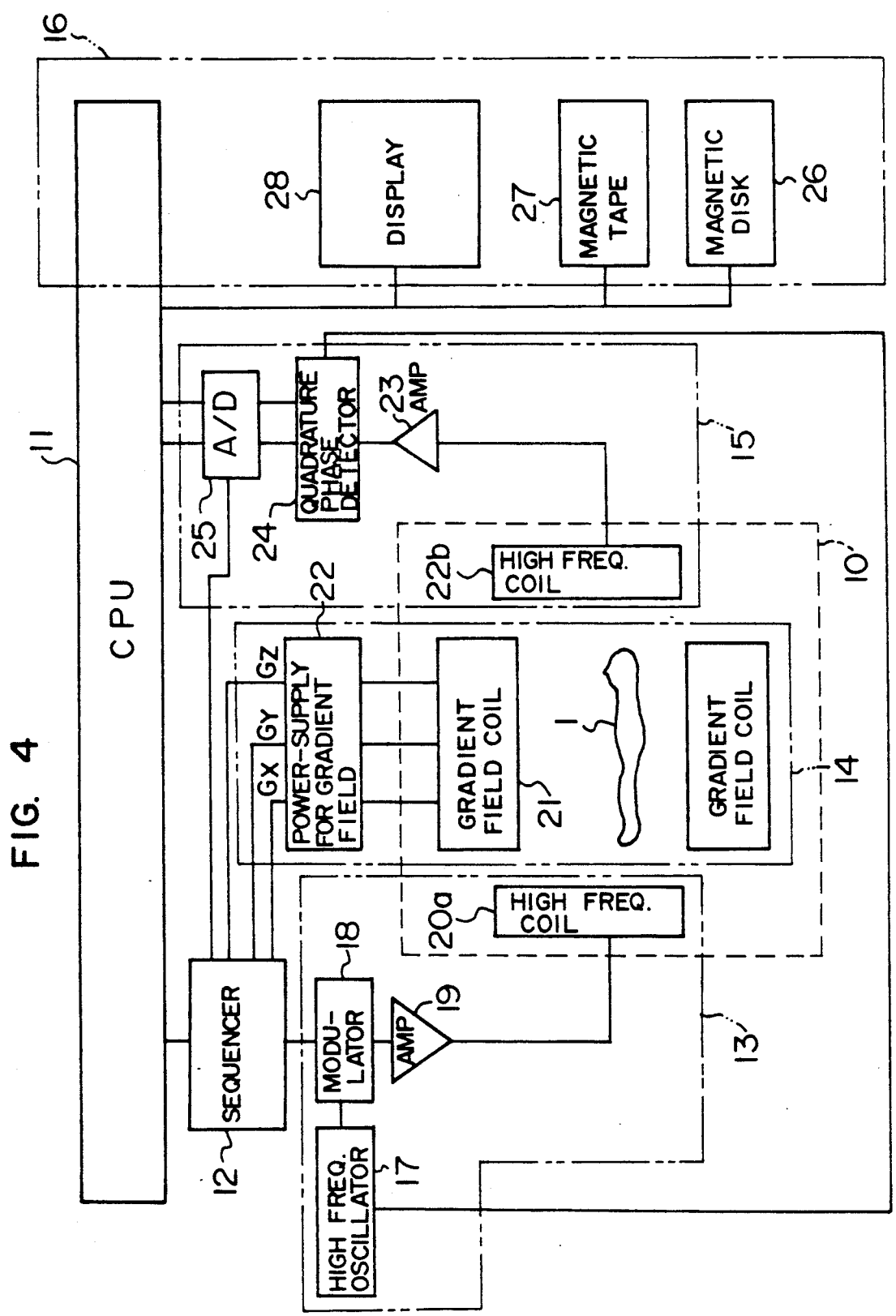
FIG. 4 is a block diagram showing a general arrangement of an NMR imaging system to which the present invention is applied.

FIG. 4 is a block diagram showing a general arrangement of a nuclear magnetic resonance or NMR imaging system according to an embodiment of the invention. The NMR imaging system is designed to take tomographic images of an object 1 under inspection by making use of the nuclear magnetic resonance (NMR) phenomenon and includes a static magnetic field generating magnet assembly 10, a central processing unit (hereinafter referred to as CPU) 11, a sequencer 12, a radiation pulse transmitter unit 13, a gradient magnetic field generating unit 14, an echo receiver unit 15 and a signal processing unit 16. The static magnetic field generating magnet unit 10 serves for generating a strong and uniform static magnetic field around the object 1 to be inspected in a direction coinciding with or orthogonal to the longitudinal direction of the object 1 and includes magnetic field generating means of a permanent magnet type or normal conductive magnet type or of a superconducting magnet type which are disposed within a space having a certain extent around the object 1 under inspection. The sequencer 12 operates under the control of the CPU 11 for issuing and sending various commands required for collecting the data of tomographic images of the object 1 to the transmitter unit 13, the gradient magnetic field generating unit 14 and the receiver unit 15. The transmitter unit 13 is composed of a high frequency oscillator 17, a modulator 18, a high frequency amplifier 19 and a high frequency coil 20a for radiation pulse transmission, wherein a high-frequency pulse signal outputted from the high frequency oscillator 17 undergoes an amplitude modulation by the modulator 18 in accordance with a corresponding command issued by the sequencer 12. The amplitude-modulated high-frequency pulse signal is then amplified by the high frequency amplifier 19 and subsequently supplied to the high frequency coil 20a disposed closely to the object 1 under inspection, which is thus irradiated with electromagnetic wave pulses. The gradient magnetic field generating unit 14 is composed of gradient magnetic field coils 21 wound in the directions corresponding to the three axes X, Y and Z of a Cartesian coordinate system, respectively, and gradient magnetic field power supply sources 22 for driving the associated coils 21, respectively. By activating the gradient magnetic field power supply sources 22 of the coils 21 in accordance with a command issued by the sequencer 12, there can be applied to the object 1 under inspection three gradient magnetic fields Gx, Gy and Gz in the axial direction X, Y and Z, respectively. At this juncture, it should be mentioned that a slice plane relative to the object 1 under inspection can be set up in dependence on the manner in which the gradient magnetic fields mentioned above are applied to the object 1. The receiver unit 15 is composed of a high frequency coil 20b for receiving echoes, an amplifier 23, a quadrature phase detector 24 and an analogue-to-digital or A/D converter 25, wherein electromagnetic waves (NMR signal) emitted from the object 1 under inspection in response to the irradiation with electro-magnetic wave from the high frequency coil 20a of the transmitter unit are detected by the high frequency coil 20b disposed closely to the object 1 and supplied to the A/D converter 25 through the amplifier 23 and the quadrature phase detector 24 to be converted into a digital signal. At that time, the NMR signal is sampled by the quadrature phase detector 24 under the timing commanded by the sequencer 12 to derive collected data of two series of real and imaginary numbers, respectively, wherein the corresponding signals are sent to the signal processing unit 16. The latter is composed of the CPU 11, storages such as a magnetic disk system 26, a magnetic tape recorder 27 and the like, and a display 28 such as a CRT (cathode-ray tube) or the like. The CPU 11 is adapted to execute Fourier transformation, computation of coefficients for correction or filtration, processing for eliminating artifacts ascribable to motions of the object under inspection, processing for reconstituting the tomographic image and others, whereby a signal intensity distribution on a given sectional plane or an equivalent distribution obtained by performing appropriate operation on a plurality of signals is processed for deriving image data to be visualized as an image on the display 28. Parenthetically, in the NMR imaging system shown in FIG. 4, the high frequency coils 20a and 20b for transmission and reception of electromagnetic waves are disposed within a magnetic field space of the static magnetic field generating magnet unit 10 disposed around the object 1 to be inspected.

Figure 5:
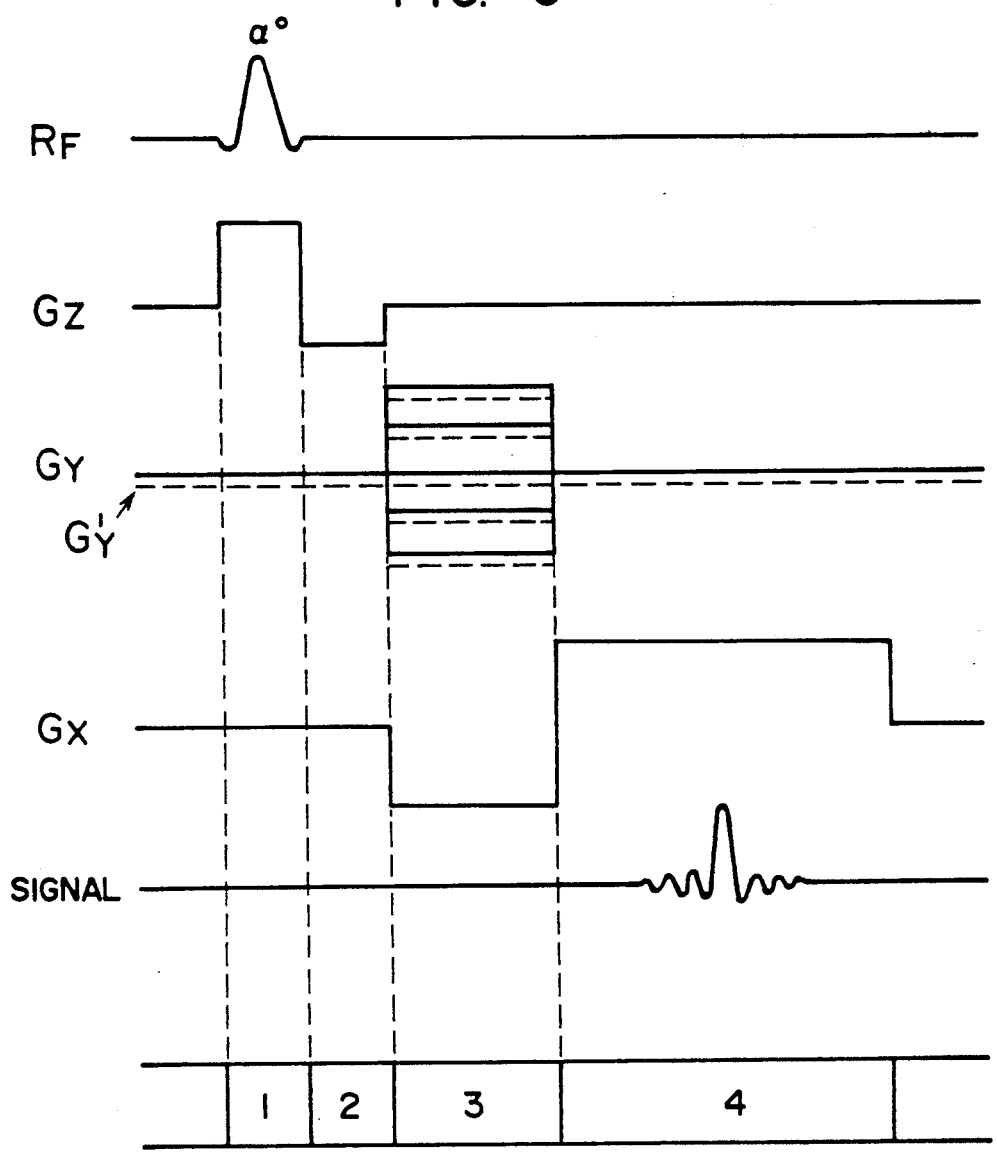
FIG. 5 is a diagram showing a pulse sequence for executing a preliminary measurement according to the teachings of the present invention.

FIG. 5 is a view for illustrating a measuring sequence based on the gradient echo method for carrying out a preliminary measurement according to the teachings of the present invention. Referring to the figure, in an interval 1, radio frequency (RF) pulses for selective excitation are applied at an angle α equal to or smaller than 90° together with the gradient magnetic field Gz of the slicing direction. In an interval 2, a gradient magnetic field of a negative direction is applied for canceling out phase rotations brought about at locations in the slicing direction during the slice selecting excitation by the applied gradient magnetic field of the slicing direction. In an interval 3, a gradient magnetic field for phase encoding is applied to thereby add rotations to the nuclear spins in dependence on the locations or positions in the Y-direction. Further, in an interval 3, a frequency encoding (read-out) gradient magnetic field is applied for the purpose of dephasing previously the nuclear spins (i.e. inverting the direction of phase rotation) such that the origin of the time base or axis is located at the center of an interval 4 when the NMR signal ia aquired in the interval 4. In the interval 4, the frequency encoding gradient magnetic field is applied and measurement of the NMR signal is carried out.

With a view to adding the nuclear spins in a two-dimensional image region having a certain thickness with rotations of magnitudes which depend on the spatial coordinates, encoding is performed in the two directions X and Y, separately. More specifically, according to the procedure illustrated in FIG. 5, the X-direction is selected as the frequency encoding direction (read-out direction) while the Y-direction is defined as phase encoding direction.

In the frequency encoding direction, phases at both ends of the field of view have to be deviated by $N\pi$ from each other upon reading of the spin echo signals. To this end, relation given by the following expression must be satisfied:

$$\gamma Gx \cdot D \cdot Tx = N\pi \ldots \quad (1)$$

where
Tx represents a frequency encoding time,
γ represents a gyromagnetic ratio of proton of a nucleus of concern ($2.6751 \times 10^4$ rad/sec/Gauss),
Gx represents the intensity of the gradient magnetic field in the frequency encoding direction,
D represents a diameter of the field of view, and
N represents the number of samplings for measurement.

With regards to the phase encoding direction, when the phase encoding is performed M times, it is required that phases are deviated at both ends of the visual field of view by $M\pi$ at maximum. Accordingly, the relation given by the following expression has to be satisfied:

$$\gamma Gy \cdot D \cdot Ty = M\pi \ldots \quad (2)$$

where
Ty represents a time for which phase encoding pulse is applied,
Gy represents maximum intensity of the gradient magnetic field in the phase encoding direction, and
M represents a number of times the phase encoding is performed.

Parenthetically, it is assumed that the field of view is in the form of a square region.

The gradient magnetic field of the frequency encoding direction is employed for encoding the X-spatial coordinates in terms of frequency by applying the gradient magnetic field of the same intensity upon every phase encoding. On the other hand, for the measurement of the NMR signal in the phase encoding direction, the value of Gy is changed to thereby change the phase encoding quantity $\gamma Gy \cdot D \cdot Ty$ by $\pi$ so that the intensity of the gradient magnetic field at every encoding satisfies the following condition:

$$\gamma Gy \cdot D \cdot Ty = \left(-\frac{M}{2} + 1\right)\pi, \ldots, -\pi, 0, \pi, \ldots, \frac{M}{2}\pi \quad (3)$$

In this way, there are collected two-dimensional data of measurement including N samples in the X-direction and M samples in the Y-direction. Ordinarily, in the measurement of the NMR signal, real parts and imaginary parts are also collected simultaneously by resorting to a QPD (Quadrature Phase Detection) procedure for measuring sin-signal and cos-signal independently. Accordingly, there can be obtained complex data in a number of N×M samples. By transforming the complex data through Fourier transformation an NMR image can be constructed.

In this way, the NMR image is obtained through Fourier transformation of the data resulting from the measurements carried out by changing the phase encoding quantity at every time when the measurement is repeated.

Now, let's consider the gradient echo method. In the case of the gradient echo method, cancellation of rotation of the signal phase by resorting to the use of the selective excitation RF pulse of 180° is not performed, and thus the gradient echo method differs from the spin echo method in this respect. Consequently, influence of nonuniformity of the static magnetic field making appearance in the form of phase rotation upon measurement of the image signal cannot be canceled out. Accordingly, when the phase encoding direction is selected in the direction in which the nonuniformity of the static magnetic field or the linear component thereof exists, the measurement will result in that the position of the peak is shifted in the phase encoding direction. More specifically, the peak in the phase encoding direction should intrinsically make appearance at zero phase encoding (point A in FIG. 2). However, the peak makes appearance at a deviated position such as of k encoding (point B in FIG. 2) due to the nonuniformity of the static magnetic field.

Figure 1:
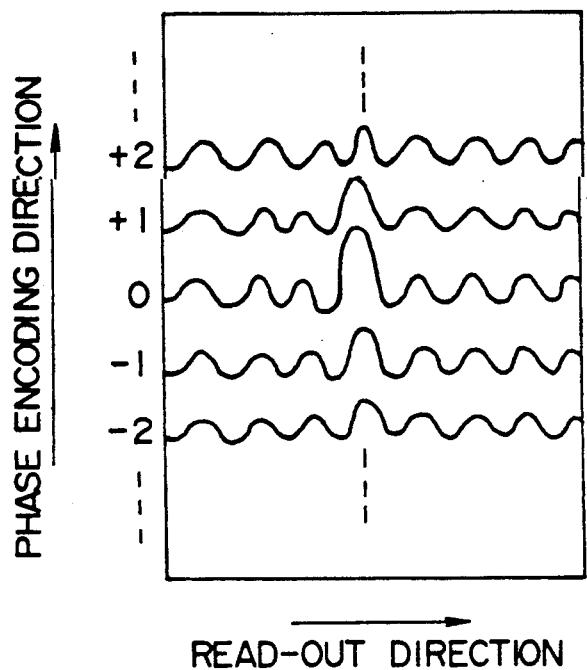
FIGS. 1 and 2 are diagrams showing schematically measured data.
Figure 2:
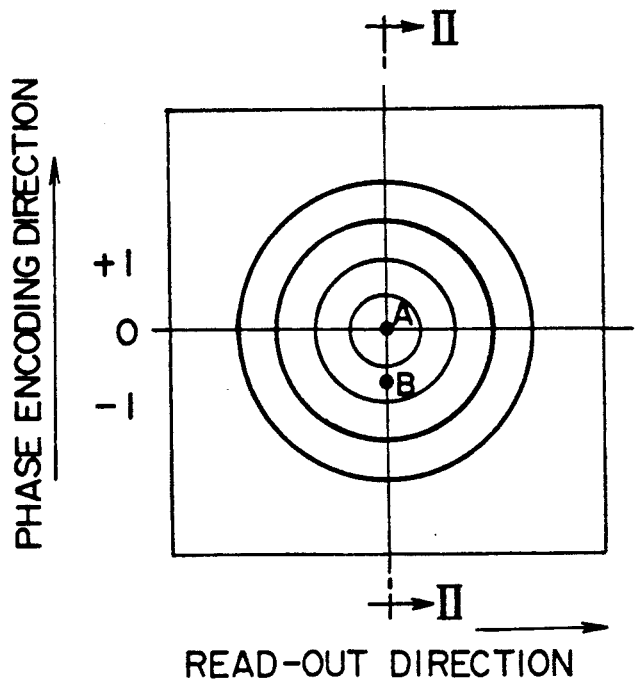
Figure 3:
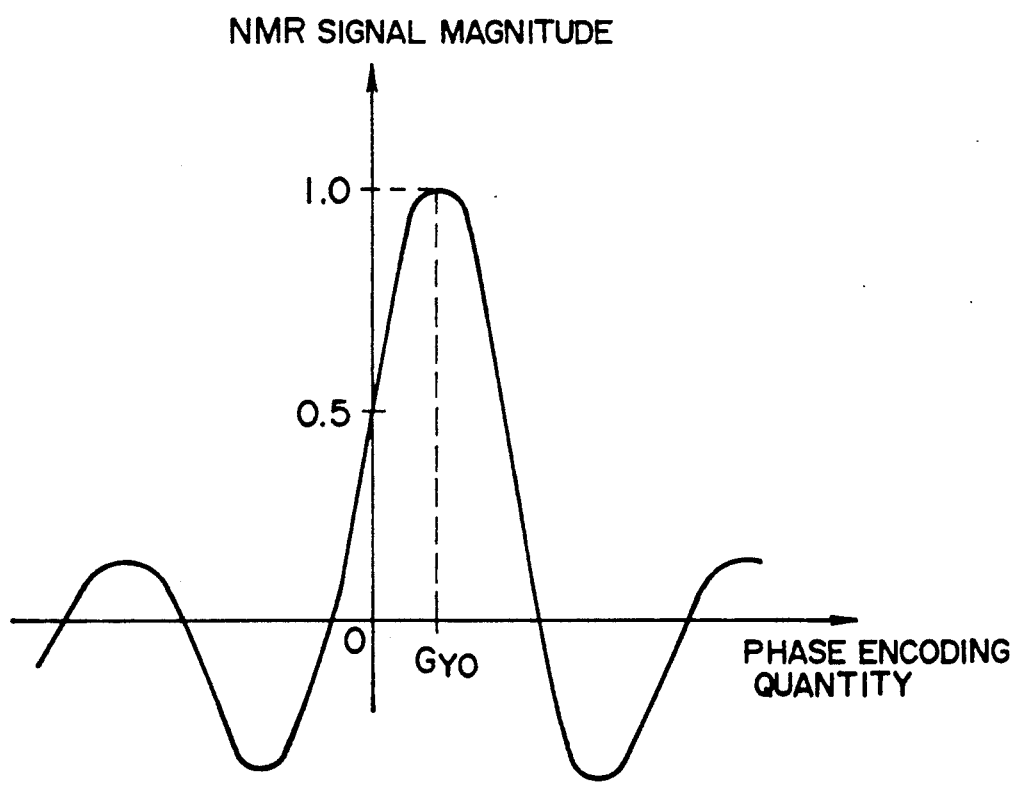
FIG. 3 is a sectional view taken along a line II—II in FIG. 2.

FIG. 3 is a sectional view taken along a line II—II in FIG. 2 for illustrating the deviation or shift of the peak. Referring to FIG. 5, let's assume that a nonuniform static magnetic field is present in the phase encoding direction whose intensity varies linearly as a function of positions, as indicated at Gy'. In that case, even in the interval during which the phase encoding gradient magnetic field is not applied, the phase rotation is imparted to the nuclear spin till the time point for the signal measurement independent or regardless of the intrinsic phase encoding. As a result of this, the encoding quantity which should intrinsically be zero is measured as a deviated value such as the encoding quantity k in dependence on the phase rotation that the nuclear spin has experienced. This results in that the zero encoding which represents the center of the phase encoding is measured as deviated to the encoding quantity k in appearance. As can be seen in FIG. 3, when the linear component of the nonuniformity in the static magnetic field is represented by Gyo, the following relation applies valid:

$$\gamma \cdot Gyo \cdot D \cdot Ty = k\pi \ldots \quad (4)$$

where k represents a rational number.

The preliminary measurement taught by the present invention is adopted for the purpose of determining the linear component of nonuniformity in the static magnetic field by measuring extent or magnitude of the deviation of the signal peak from the point corresponding to the phase encoding quantity of zero. Accordingly, the preliminary measurement can be realized by performing measurement for only a few encoding quantities within a narrow region including the phase encoding point of zero. In particular, when the value of k representing the signal peak cannot be given by an integer, the preliminary measurement may be performed by applying a phase encoding gradient magnetic field of more definite intensity, as occasion requires.

As can be seen from the expression (4) mentioned above, the linear component Gyo can be determined when the value of k representing the signal peak is known. Accordingly, when a gradient magnetic field −Gyo having intensity corresponding to the linear component Gyo is applied with a polarity inverted relative to the latter upon intrinsic measurement, the signal can be measured in the state where the nonuniformity component of the static magnetic field has been canceled out.

Thus, by applying a compensating method based on the preliminary measurement according to the present invention, it is possible to obtain the signal peak value at zero phase encoding, even when the static magnetic field suffers from nonuniformity. In this conjunction, it should be mentioned that when the linear nonuniformity component of the static magnetic field makes appearance in the Z-direction of Gy, as with the case of Gz shown in FIG. 5, the influence of the linear component tends to decrease the signal peak value.

On the other hand, when the linear non-uniformity component of the static magnetic field is present in the X-direction as with the case of Gx shown in FIG. 5, i.e. in the read-out direction, the influence of the linear component exerts such influence that the signal peak position is shifted in the read-out direction.

In the foregoing, description has been made of a method for eliminating the influence of nonuniformity of the static magnetic field in the phase encoding direction. It should however be mentioned that the direction in which the linear nonuniformity component of the static magnetic field makes appearance is not necessarily restricted to the phase encoding direction. Such nonuniformity component may make appearance in the slice selecting direction or in the read-out direction. However, in any case, magnitude of the linear nonuniformity component of the static magnetic field can be determined through the preliminary measurement method by setting the phase encoding direction as the direction in which the linear nonuniformity component of the static magnetic field lies, regardless whether the linear nonuniformity component makes appearance in the slice selecting direction or in the read-out direction or in the phase encoding direction in the intrinsic measurement. More specifically, when the linear nonuniformity component makes appearance in the slice selecting direction upon intrinsic measurement, then the gradient magnetic field of −Gyo for canceling out the influence of nonuniformity of the static magnetic field is applied in the direction in which the nonuniformity is present, whereafter the intrinsic signal measuring pulse sequence can be executed. At that time, the nonuniformity canceling gradient magnetic field of −Gyo must be continuously applied until the measuring pulse sequence has been completed. Similarly, in case the non-uniformity component exists in the read-out direction, the intrinsic signal measuring pulse sequence may be performed after the nonuniformity canceling gradient magnetic field is applied in the read-out direction. At this time, the nonuniformity canceling gradient magnetic field of −Gyo has to be continuously applied until the intrinsic measuring sequence has been completed, as in the case where the nonuniformity component exists in the slice selecting direction.

It is impossible to predict previously in which of the directions the nonuniformity of the static magnetic fields makes appearance. To cope with this problem, it is sufficient to carry out the preliminary measurements by setting the phase encoding axis in the three directions corresponding to the three orthogonally intersecting axes, respectively, whereon the gradient magnetic field of the intensity corresponding to the linear nonuniformity component of the static gradient field is applied with polarity inverted relative to that of the linear nonuniformity component in the direction in which it makes appearance. In this manner, there can be obtained an NMR image which evades the influence of the nonuniformity of the static magnetic field.

Now, description will be turned to a concrete example of the pulse sequence for carrying out the intrinsic or intended NMR measurement by applying the gradient magnetic field determined by the preliminary measurement for canceling out the influence of the nonuniformity of the static magnetic field in the NMR imaging system.

In the first place, let's consider the spin echo method for imaging measurement in which the read-out direction is selected as the X-direction with the phase encoding direction being set as the Z-direction.

In the case of the NMR measurement based on the spin echo method, no phase rotation ascribable to the nonuniformity of the static magnetic field takes place in the phase encoding direction owing to the nature inherent to this method for the reason mentioned below. Namely, when the linear component of non-uniformity of the static magnetic field is present in the phase encoding direction, the phase rotation experience by the nuclear spin during a period between emission of the 90°-pulse and that of the 180°-pulse is just opposite to the phase rotation experienced by the nuclear spin during a period between emission of the 180°-pulse and the measurement of the echo signal, whereby the former is canceled out by the latter.

However, the influence of the linear non-uniformity component of the static magnetic field makes appearance in the read-out direction in which the echo signal is read. No assuming that the preliminary measurement performed with the Z-axis being set as the phase encoding direction for measuring the gradient echo results in that the signal peak position is shifted in the phase encoding direction by an amount $\omega_{zo}$ as measured in terms of angular frequency, then the following relation must be satisfied:

$$\gamma Gzo \cdot D \cdot Tz = \omega_{zo} \ldots \quad (5)$$

where
 Tz represents a time for which the phase encoding pulse is applied in the preliminary measurement,
 $\gamma$ represents gyromagnetic ratio of proton as a nucleus of concern,
 Gzo represents a nonuniformity component of the static magnetic field in the Z-axis direction, and
 D represents the field of view at the time of measurement.

In this case, the read-out direction is considered to extend along the X-axis. In this conjunction, the intensity of the gradient magnetic field intensity is represented by Gx. The presence of Gzo satisfying the abovementioned relation in the Z-axis direction at the time of the echo reading is ultimately equivalent to the measurement in such state in which the slice plane is inclined due to the gradient magnetic field in the Z-axis even though the NMR signal is inherently intended to be read out in the X-axis direction. More specifically, the magnetic field $H(x,z)$ for the measurement is given by $$H(x,z) = Ho + Gx \cdot x + Gzo \cdot z \ldots \quad (6)$$

where Ho represents the intensity of the static magnetic field. Unless the static magnetic field is nonuniform, only the first and second term of the right side of the above expression should be present. However, because of the presence of nonuniformity in the static magnetic field, the third term makes appearance in the right side of the above expression.

When the linear component of the static magnetic field is present in the phase encoding direction upon performing the intrinsic NMR measurement in accordance with the spin echo method, the data corresponding to those illustrated in FIG. 2 become such that the phase rotation advances in the read-out direction as the distance from the center changes in the phase encoding direction, which results in that the image is distorted in dependence on magnitude of nonuniformity component of the static magnetic field.

Figure 6:
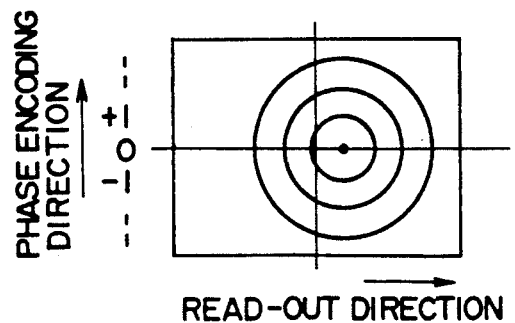
FIG. 6 is a schematic diagram showing in what manner the data measured undergo variation.

Next, let's discuss a problem which may arise when the read-out direction for the intrinsic NMR measurement is selected in the Z-axis direction. In that case, the gradient magnetic field for the NMR signal measurement is superimposed with the gradient magnetic field due to the nonuniformity of the static magnetic field in the read-out direction. Consequently, the position of the signal peak is shifted only in the read-out direction, as shown in FIG. 6. When the gradient magnetic field for the signal measurement is represented by Gz with the gradient field component due to nonuniformity of the static magnetic field being represented by Gzo, the signal as read out represents the value measured under application of the gradient magnetic field given by Gz+Gzo. In other words, the following relation applies valid:

$$\omega_z + \omega_{zo} = \gamma (Gz + Gzo) \cdot D \cdot Tz \ldots \quad (7)$$

where Gz represents a time for which the measuring signal is applied and D represents the field of view. Since the signal measurement in the read-out direction is performed intrinsically under application of Gz, the size of the image changes in the Z-axis direction due to the component Gzo, resulting in that the image distorted by (Gz+Gzo)/Gz is reconstructed.

As will be apparent from the above description, in the case of the NMR signal measurement according to the spin echo method, influence of nonuniformity of the static magnetic field makes appearance in both the phase encoding direction and the read-out direction.

Figure 7:
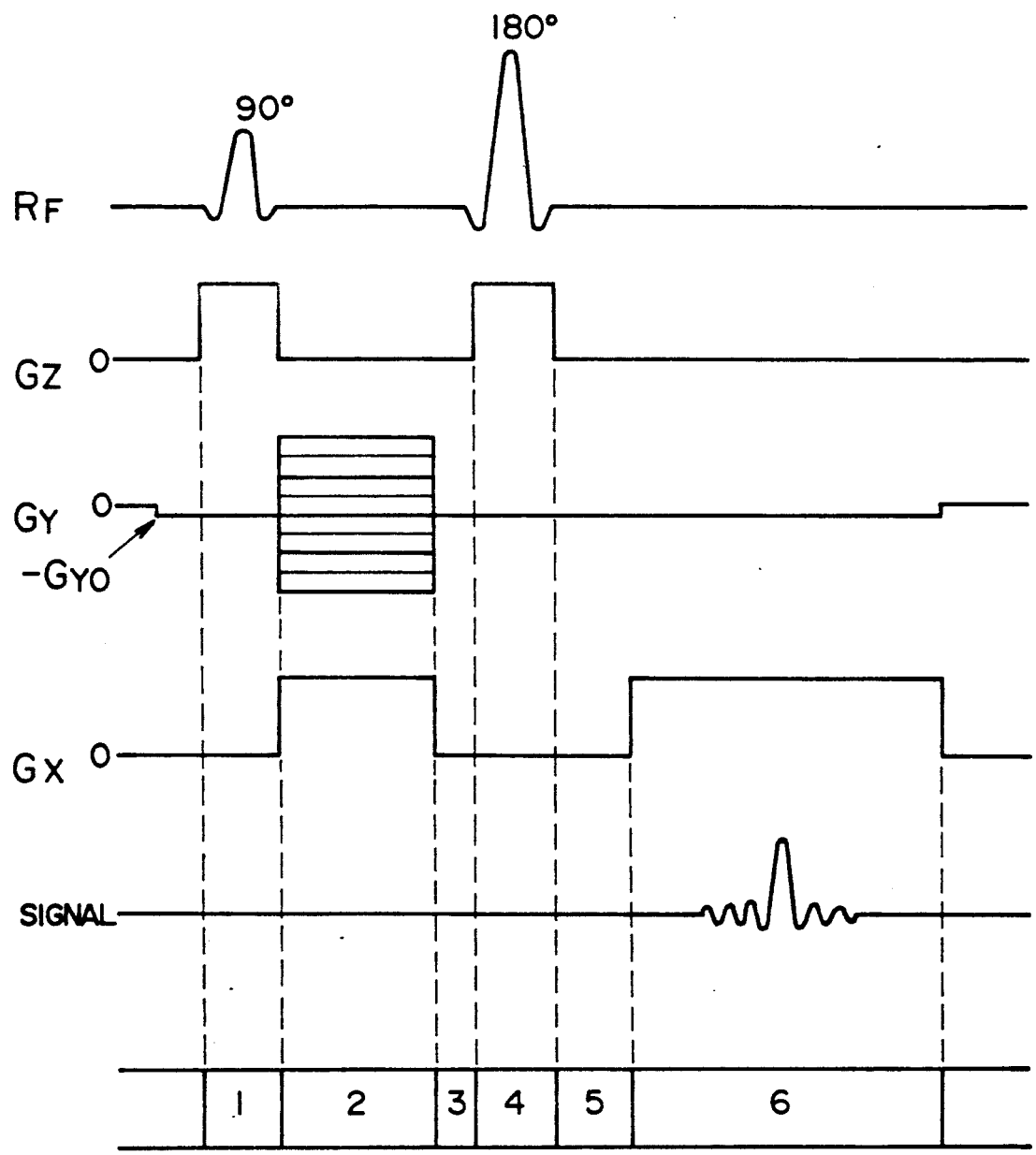
FIG. 7 is a diagram showing a pulse sequence in carrying out a spin echo method to which the present invention is applied.

FIG. 7 shows a pulse sequence executed by resorting to the spin echo method for realizing actually the effect of canceling out the influence of non-uniformity of the static magnetic field in the phase encoding direction in succession to the measurement of the nonuniformity by the preliminary measurement mentioned above. When magnitude of the linear non-uniformity component of the static magnetic field as determined by the preliminary measurement is represented in terms of the intensity of the gradient magnetic field, e.g. in terms of Gyo, it is possible to suppress the signal peak shift from occurring in the phase encoding direction due to the nonuniformity in the static magnetic field by applying the gradient magnetic field $-Gyo$ for canceling out the linear nonuniformity component Gyo during the measurement of the NMR signal. In this manner, the NMR signal measurement can be performed without being affected by nonuniformity of the static magnetic field.

Explaining the pulse sequence operation by reference to FIG. 7, there are shown at a row labeled RF the timing for irradiation with radio frequency signals and envelops thereof for selective excitation. At a row Gz, timing for applying the gradient magnetic field in the slicing direction is shown. At a row labeled Gy, there are illustrated a timing at which the gradient magnetic field of the phase encoding direction is applied and a signal amplitude therefor which is varied for the NMR measurement. At a row labeled Gx, there is illustrated the timing at which the gradient magnetic field for the frequency encoding (read-out) is applied. Finally, shown at a row labeled "Signal" is an NMR signal as measured. Shown at the lowermost row are time intervals 1 to 6 of the measuring sequence. Incidentally, X, Y and Z axes are those of a Cartesian coordinate system. In the time interval 1, the 90°-selective excitation pulse is emitted and the slice selecting gradient magnetic field Gz is applied. In the interval 2, the gradient magnetic field Gy of the phase encoding direction is applied to add the nuclear spins with rotations in dependence on the positions in the Y-direction. Additionally at the interval 2, the frequency encoding gradient magnetic field Gx is applied for the purpose of dephasing previously the nuclear spins (i.e. inverting the direction of phase rotation) so that the origin of the time axis or base is positioned at the center of the interval 6 when the NMR signal is measured. In the interval 3, no signal is generated. In the interval 4, the 180°-selective excitation pulse is emitted and the gradient magnetic field Gz of the slicing direction is applied. At the interval 5, no signal is emitted. In the interval 6, the frequency encoding gradient field Gx is applied and the NMR signal is measured.

For carrying out the NMR imaging sequence, the object 1 under inspection is irradiated with RF pulses in the state where the gradient magnetic field is applied in addition to the static magnetic field, as described above, whereon the gradient magnetic field is applied for encoding the NMR signals emitted from a region of the object 1 being inspected to thereby acquire the NMR signals. Subsequently, the image is reconstructed by using the NMR signals.

Description made hereinbefore in conjunction with FIG. 5 applies the same to the phase encoding gradient magnetic field.

Next, let's consider application of the invention to the NMR imaging process based on the gradient echo method. It is assumed that the phase encoding direction lies in the Z-axis direction and that the linear nonuniformity component of the static magnetic field makes appearance in the phase encoding direction. In case the NMR signal is measured with the X-direction being selected as the read-out direction. there applies valid a relation given by the following expression between the measured MR data and the image data.

$$F\{M(x, z) \exp (j\omega_{zo}\cdot z)\} = Dr(\omega_x, \omega_z - \omega_{zo}) + jDi(\omega_x, \omega_z - \omega_{zo}) \ldots \quad (8)$$

where
F represents Fourier transformation,
M(x, z) represents data corresponding to the gradation of the MR image,
$\omega_{zo}$ represents in terms of angular frequency the deviation of the signal peak position in the Z-direction as determined by the preliminary measurement, and
$Dr(\omega_x, \omega_z - \omega_{zo})$ and $Di(\omega_x, \omega_z - \omega_{zo})$ represent real parts and imaginary parts, respectively, of the measurement data.

In the instant case, the phase rotation advances in the Z-axis direction set as the phase encoding direction. However, this term (phase rotation) presents no problem when expressed in an absolute value upon Fourier transformation for obtaining the image data. Influence to the X-axis direction which is the read-out direction gives rise to the problem of oblique mentioned hereinbefore in conjunction with the spin echo method, bringing about distortion in the image.

When the Z-axis direction is selected as the read-out direction, deviation of the signal peak position takes place in the read-out direction as well, as shown in FIG. 6, and the signal measurement is performed in the state in which the gradient field component Gzo ascribable to nonuniformity of the static magnetic field is superimposed to the intrinsic gradient magnetic field Gz. As a result of this, the size of the reconstructed image is distorted in the read-out direction, as in the case of the spin echo method.

Figure 8:
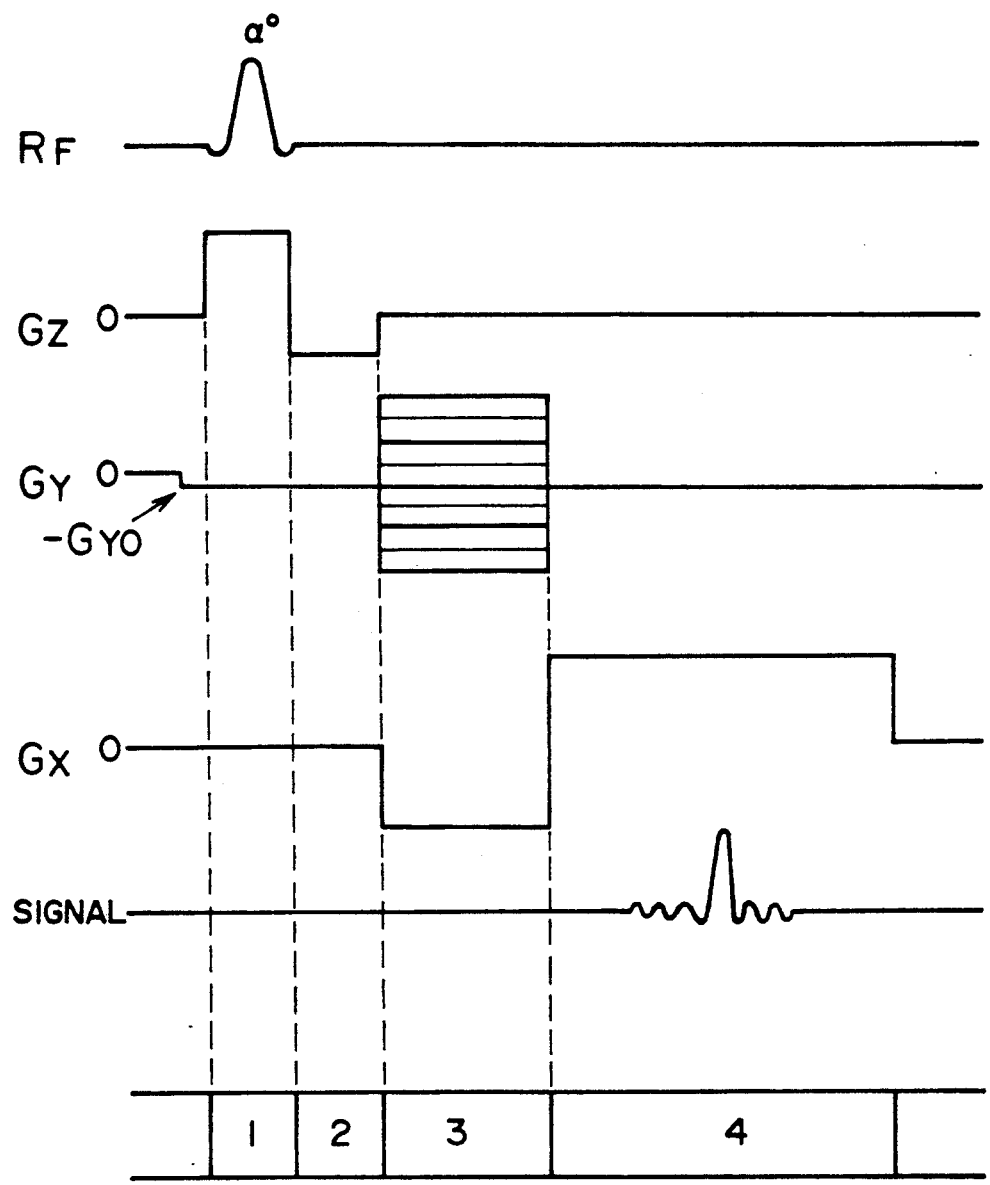
FIG. 8 is a diagram showing a pulse sequence in carrying out a gradient echo method to which the present invention is applied.

FIG. 8 is a timing chart for illustrating a pulse sequence according to the gradient echo method to which the present invention is applied. As can be seen in FIG. 8, when the gradient magnetic field of $-Gyo$ for cancelling out the influence of nonuniformity of the static magnetic field is applied in the phase encoding direction throughout the intervals 1 to 4, as in the case of the spin echo method, there can be realized the signal measurement which is insusceptible to the influence of nonuniformity of the static magnetic field. Operations at the intervals 1 to 4 are the same as those described hereinbefore by reference to FIG. 5.

I claim:

1. A method of compensating for nonuniformity of a static magnetic field in a nuclear magnetic resonance (NMR) imaging system, comprising the steps of:
   (a) selecting one of X-, Y- and Z-axes of a Cartesian coordinate system as a phase encoding direction;
   (b) selectively exciting a region of field of view by applying a high frequency pulse of $\alpha°$ to an object under inspection;
   (c) measuring an NMR signal by applying a phase encoding gradient magnetic field and a frequency encoding gradient magnetic field after application of said high frequency pulse of $\alpha°$, the step (c) of measuring being performed a plurality of times while changing said phase encoding gradient magnetic field;
   (d) detecting a peak value of the measurement data obtained by step (c) and determining a phase encoding quantity at which said peak value can be obtained;
   (e) determining an intensity and a plurality of a linear component of nonuniformity components of the static magnetic field in said direction selected by obtaining an intensity and a polarity of said phase encoding gradient magnetic field corresponding to said peak value; and
   (f) executing a pulse sequence for measuring the NMR signal by applying a gradient field added with a compensating gradient magnetic field having the same intensity as said linear component and a polarity opposite to that of said linear component to a gradient magnetic field applied in the selected direction.

2. A method according to claim 1, wherein said step of measuring the NMR signal includes a step of applying said phase encoding gradient magnetic field in a narrow region including a phase encoding quantity of zero.

3. A method according to claim 1, wherein said step of determining the intensity of the gradient magnetic field corresponding to said phase encoding quantity and the polarity of said field includes a step of determining said phase encoding quantity in accordance with $$\gamma \cdot Gy \cdot D \cdot Ty = k\pi$$

where $k\pi$ represents said phase encoding quantity, $\gamma$ represents a gyromagnetic ratio, Gy represents the intensity of the gradient magnetic field of concern, D represents a diameter of the field of view, Ty represents a time for which said gradient magnetic field of Gy is applied, and k represents a rational number.

4. A method according to claim 1, wherein the step of executing the pulse sequence for measuring said NMR signal includes a step of executing a pulse sequence according to a spin echo method.

5. A method according to claim 1, wherein the step of executing the pulse sequence for measuring said NMR signal includes a step of executing a pules sequence according to a gradient echo method.

6. A nuclear magnetic response (NMR) imaging system having an apparatus for compensating for nonuniformity of a static magnetic field, comprising the steps of:
- (a) means for selectively exciting a region of field of view by applying a high frequency pulse of a° to an object under inspection;
- (b) means for applying a phase encoding gradient magnetic field and a frequency encoding gradient magnetic field after application of said high frequency pulse of a° a plurality of times while changing said phase encoding gradient magnetic field;
- (c) means for measuring an NMR signal form said object under inspection;
- (d) means for detecting a peak value of the measurement data obtained for determining a phase encoding quantity at which said peak value can be obtained;
- (e) means for determining an intensity and a polarity of a linear component of nonuniformity components of the static magnetic field in said direction selected by obtaining an intensity and a polarity of said phase encoding gradient magnetic field corresponding to said peak value; and
- (f) means for executing a pulse sequence for measuring the NMR signal by applying a gradient magnetic field added with a compensating gradient magnetic field having the same intensity as that of said linear component and a polarity opposite to that of said linear component to a gradient magnetic field applied in the selected direction.

7. An apparatus according to claim 6, wherein said means for applying said phase encoding gradient magnetic field includes means for applying said phase encoding gradient magnetic field in a narrow region including a phase encoding quantity of zero.

8. An apparatus according to claim 6, wherein said means for determining the intensity of the gradient magnetic field corresponding to said phase encoding quantity and the polarity of said gradient magnetic field includes means for determining said phase encoding quantity in accordance with $$\gamma \cdot Gy \cdot D \cdot Ty = k\pi$$

where $k\pi$ represents said phase encoding quantity, $\gamma$ represents a gyromagnetic ratio, Gy represents the intensity of the gradient magnetic field of concern, D represents a diameter of the visual field, Ty represents a time for which said gradient magnetic field of Gy is applied, and k represents a rational number.

9. An apparatus according to claim 6, wherein said means for executing the pulse sequence for measuring said NMR signal includes means for executing a pulse sequence according to a spin echo method.

10. An apparatus according to claim 6, wherein the step of executing the pulse sequence for measuring said NMR signal includes a step of executing a pulse sequence according to a gradient echo method.

* * * * *